United States Patent [19]

Sauer

[11] Patent Number: 4,471,341
[45] Date of Patent: Sep. 11, 1984

[54] PIPE-LINED CCD ANALOG-TO-DIGITAL CONVERTER

[75] Inventor: Donald J. Sauer, Plainsboro, N.J.
[73] Assignee: RCA Corporation, New York, N.Y.
[21] Appl. No.: 354,204
[22] Filed: Mar. 3, 1982
[51] Int. Cl.³ ........................................ H03K 13/02
[52] U.S. Cl. ...................... 340/347 AD; 340/347 SH; 357/24
[58] Field of Search ................ 340/347 AD, 347 SH; 377/57, 62, 63; 357/24

[56] References Cited

U.S. PATENT DOCUMENTS

| | | | |
|---|---|---|---|
| 4,070,667 | 1/1978 | Eichelberger | 340/347 NT |
| 4,104,543 | 8/1978 | Maeding | 307/221 D |
| 4,115,766 | 9/1978 | Smith | 340/347 AD |
| 4,136,335 | 1/1979 | Tompsett | 340/347 AD |
| 4,148,016 | 4/1979 | Alizon et al. | 340/347 AD |
| 4,164,734 | 8/1979 | Jensen | 340/347 AD |
| 4,171,521 | 8/1979 | Wang et al. | 340/347 AD |
| 4,194,187 | 3/1980 | Glendinning | 340/347 AD |
| 4,302,686 | 11/1981 | Baertsch et al. | 307/221 D |
| 4,306,221 | 12/1981 | Jiang et al. | 340/347 AD |
| 4,306,224 | 12/1981 | Geller et al. | 340/347 AD |
| 4,326,192 | 4/1982 | Merrill | 340/347 AD |
| 4,336,525 | 6/1982 | Chapple | 340/347 AD |
| 4,375,059 | 2/1983 | Schlig | 340/347 AD |

FOREIGN PATENT DOCUMENTS

| | | |
|---|---|---|
| 0021142 | 1/1981 | European Pat. Off. |
| 1194778 | 6/1970 | United Kingdom |
| 1238898 | 7/1971 | United Kingdom |
| 1536611 | 12/1978 | United Kingdom |

OTHER PUBLICATIONS

Kyung, "IEEE Journal of Solid-State Circuits", vol. SC-15, No. 2, Apr. 1980, pp. 255-257.
"Digitals in Broadcasting", Howard E. Ennes, pp. 162-191, Howard W. Sams, 1977.
"Design of a Circulating-Type Analogue-Digital Converter Using Bucket Brigade Delay Lines", *Electronics Letters*, 6 Sep. 1973, vol. 9, No. 18, pp. 428-430.
"A Monolithic (Single-Chip) Video A/D converter", W. R. Bucklen, *SMPTE Journal*, Aug. 1980, vol. 89, pp. 573-578.
"All MOS Charge Redistribution Analog-to-Digital Conversion Techniques", (Part 1), J. L. McCreary & P. R. Gray, *IEEE Journal of Solid State Circuits*, vol. SC-10, No. 6, Dec. 1975, pp. 371-385.

Primary Examiner—C. D. Miller
Attorney, Agent, or Firm—Joseph S. Tripoli; George E. Haas; Allen LeRoy Limberg

[57] ABSTRACT

An analog-to-digital converter (ADC) uses pipe-lined data flow through parallelled charge transfer channels in a CCD for implementing a successive-approximation conversion algorithm. Successive charge splitting divides a standard level charge packet into binary-weighted charge packets, selectively added to develop the successive approximations against which charge packets dependent on analog input signal are differentially compared. These comparisons are made using floating gate sensors and auto-zeroed sense amplifiers. A battery of progressively shorter shift registers can convert the pipelined ADC output to parallel-bit form.

10 Claims, 5 Drawing Figures

PIPE-LINED CCD ANALOG-TO-DIGITAL CONVERTER

The invention relates to charge-coupled-device (CCD) analog-to-digital converters (ADCs).

An ADC embodying the present invention uses pipelined data flow through parallelled charge transfer channels in a CCD for implementing a successive-approximation conversion algorithm. The successive-approximation algorithm is one in which in the first stage of the pipeline the most significant bit of the digitization is determined. Thereafter, in each successive stage of the pipeline, the next less significant bit of the digitization is determined by differentially comparing a representation of the analog signal input against the sum of binary weights of the previously determined bits (i.e., a quantized analog signal) and a trial bit. This trial bit has the binary weight of the bit to be determined, supposing it to be a binary ONE. A binary ONE is generated by the comparison if the representation of the analog signal input is larger; and a ZERO, if it is smaller. On the one hand, generation of a ONE causes the trial bit to be added to the quantized analog signal to refine the resolution of the quantization; and, on the other hand, generation of a ZERO causes the trial bit to be discarded. The differential comparison of the representation of the analog signal in a first charge transfer channel to a representation of quantized analog signal in a second charge transfer channel plus a distinct trial bit in a third charge transfer channel is facilitated using a floating-gate differential charge subtraction process. A battery of progressively shorter shift registers can be used to convert the pipelined ADC output from the comparators to parallel-bit form.

(This specification is written following the convention that the semiconductor substrate in which charge transfer channels are caused to exist is presumed to be oriented so the gate electrodes overlie the channels, but the convention used for convenience of description is not to be construed as limiting upon the actual physical orientation of the CCD devices, insofar as the invention or claims to it are concerned.)

Figure 1:
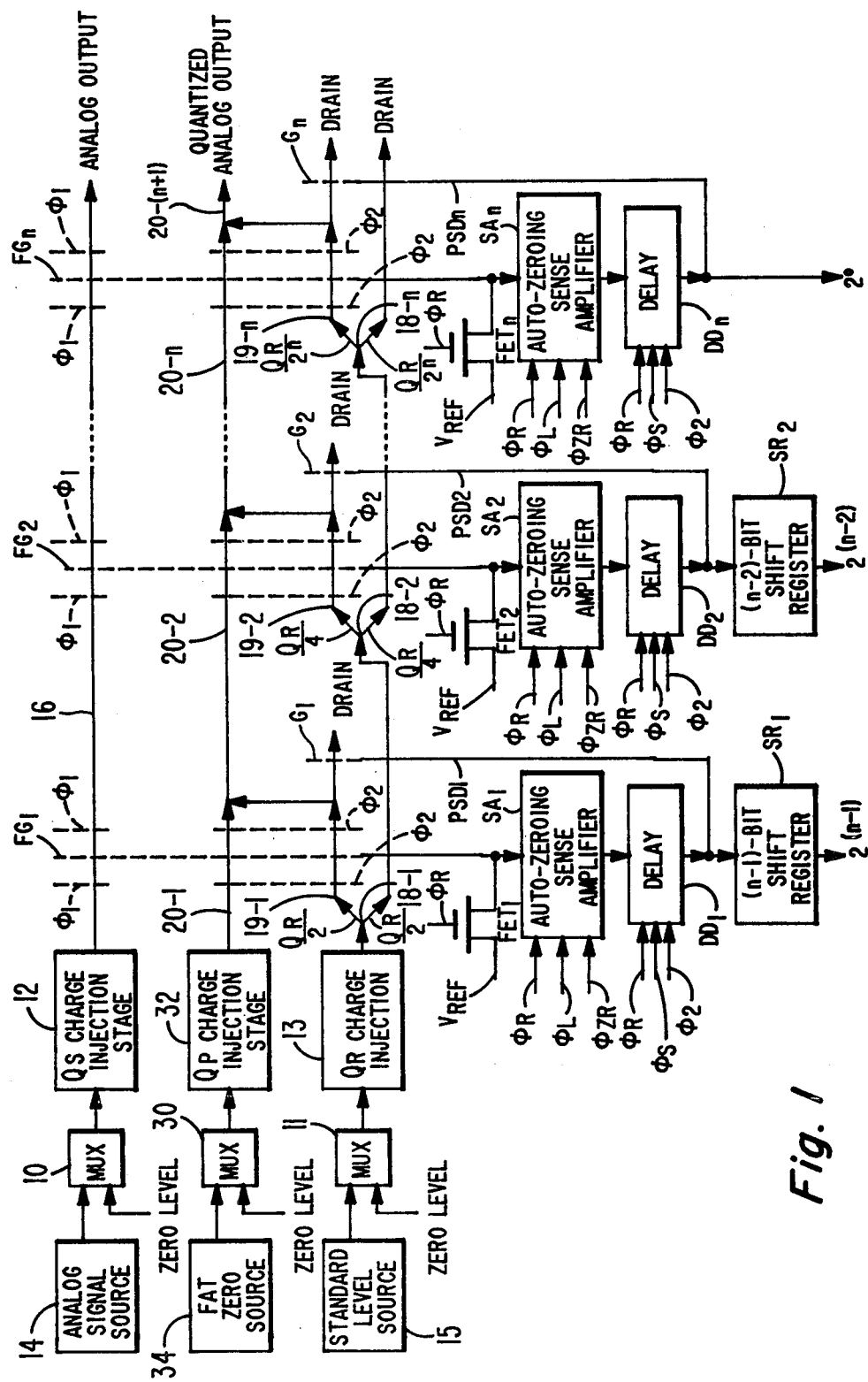
FIG. 1 is a block schematic diagram of an analog-to-digital converter embodying the present invention.

FIG. 1 shows first, second, and final ones of n sections of a CCD analog-to-digital converter, n equally the number of bits of resolution the ADC is to provide. This type of ADC operates according to a successive approximation algorithm and is capable of 8-bit resolution at video sampling rates up to 15 MHz. To obtain both high resolution and high sampling rate, the FIG. 1 ADC features pipe-lined data flow using CCD shift registers to synchronize outputs from the successive converter sections, floating-gate differential charge subtraction, and auto-zeroing high-speed sense amplifiers.

The floating-gate differential charge subtraction process, which will be described presently in greater detail, is facilitated by using complementary uni-phase clocks. Uni-phase clocking is provided a CCD channel by applying a single phase of a rectangular-wave clock signal to alternate ones of its paired storage and transfer gates and by applying to the intervening ones of its paired storage and transfer gates a direct, reference potential $V_{REF}$. To facilitate uni-phase clocking it is convenient to make $V_{REF}$ substantially equal to the average value of the rectangular-wave clock signal. This creates potential conditions in each CCD channel resembling those in a standard two-phase clocking arrangement. Complementary uni-phase clocks are provided by making the respective rectangular-wave clock signals in two CCD channels anti-phase, so one is high in potential when the other is low and vice versa. Each floating gate replaces, in each of the CCD channels underlying it, a storage gate in the normal cascade arrangement of a transfer gate biased at $V_{REF}$ followed by a storage gate also biased at $V_{REF}$.

The floating gate is recurrently clamped to $V_{REF}$ as a dc restoration measure preparatory to auto-zeroing. $V_{REF}$ being a covenient voltage to clamp to form a number of design aspects is available, already being used in uni-phase clocking; and being midway between clock potentials extremes, $V_{REF}$ is suitable for biasing the input of sense amplifiers operated from direct potentials the same as these clock extremes.

To facilitate the auto-zeroing, on alternate $\phi_1$ clock cycles a multiplexer 10 applies a zero level signal to a charge injection stage 12, while a multiplexer 30 applies a zero level signal to charge injection stage 32; and a multiplexer 11 operates on following $\phi_2$ clock cycles to apply a zero level signal to a charge injection stage 13. These zero level signals condition charge injection stages 12, 13 and 32 to inject no change into the charge transfer channels following them, for propagating empty energy wells through the charge transfer channels following them. Charge injection stages 12, 13 can be any of various types known in the art. Where they are of fill-and-spill type, injection of charge by stages 12, 13 and 32 can be inhibited by multiplexers 10, 11 and 30 selecting a very negative voltage for application to stages 12, 13 and 32. Or multiplexers 10, 11 and 30 can be provided simply by selectively inhibiting fill pulses on the source of the fill-and-spill charge injection stage.

Since the CCD shift register structures involved in the ADC are not very long, there is no need to obtain maximum charge transfer efficiency from stage to stage in these registers. So "fat zero" operation, where bias charges accompany signal charges, is unnecessary from this standpoint. Fat zero operation of charge injection stage 12 is desirable from a linearization standpoint, however. If fat zero operation is used, on alternate $\phi_1$ cycles, when multiplexer 10 selects analog signal source 14, the analog signal voltage is accompanied by a $V_{ZERO}$ reference component. The $V_{ZERO}$ component of itself would cause charge injection stage 12 to leave a non-empty energy well after the charge injection period is past, the injected charge being known as "fat zero". This value of bias charge will also accompany the samples where $V_{ZERO}$ has analog signal voltage added to it. Where fat zero operation is not used, a source 34 of fat zero level selected alternatively to zero level by multiplexer 30, multiplexer 30 and charge injection stage 32 are dispensed with. $V_{ZERO}$ in this mode of operation is that voltage at which charge injection stage 12 is at the limit of no longer injecting charge.

Linearity of charge injection by charge injection stage 13 is not a problem, since it does not inject a low level of charge when multiplexer 11 selects rather than zero level a standard level from source 15. Fat zero operation of charge injection stage 13 is unnecessary, then, and it is preferably avoided to avoid complicating later charge splitting and charge allocation circuitry.

During the clock cycles intervening between the clock cycles in which auto-zeroing is performed, multiplexer 10 selects analog input signal voltage from source 14 for application to charge injection stage 12, and multiplexer 11 selects a standard voltage level from source 15 for application to charge injection stage 13. The standard voltage level is twice a direct voltage $V_{ONE}$, as referred to the voltage at the limit where charge injection stage 13 no longer injects charge, not being exactly twice if needed to accommodate charge injection stages 12 and 13 being operated respectively with fat zero and without fat zero. $V_{ONE}$ corresponds to the value of voltage supplied from analog signal source 14, as referred to $V_{ZERO}$, which is to be that for which the most significant bit of ADC output is binary ONE while the less significant bits are all ZEROs. This standard voltage has to be somewhat smaller than the voltage which when applied to any of the charge injection stages 12, 13, and 32 would be just under that voltage which would cause overflow of the first energy well in the ensuing charge transfer channel, smaller by at least $V_{ZERO}$. It should not be much smaller, since comparator error in the comparison processes of analog-to-digital conversion is worsened.

The auto-zeroing on alternate samples clocked through the ADC causes the analog-to-digital conversion rate, or effective sample rate, to be one-half the clock rate of the clocking signals applied to the ADC charge transfer channels. An effective sampling rate of the analog input signal equal to the clock rate can be obtained by time-division-multiplexing two of the FIG. 1 ADC's by operating their complementary uni-phase clocks in anti-phase respective to each other.

Charge injection stage 12 injects negative charge packets alternatively of zero value and of variable amplitude $Q_S+Q_0$ into an "analog signal" charge transfer channel 16 over which an n-numbered plurality of floating-gate sensor electrodes $FG_1$, $FG_2$, ... $FG_n$ are disposed. $Q_0$ is the charge associated with $V_{ZERO}$ input, and $Q_S$ is the charge associated with the analog signal voltage in addition to $V_{ZERO}$. Charge transfer channel 16 is operated with uni-phase clocking, those gates not having $V_{REF}$ applied to them having the same clock phase $\phi_1$ applied to them. (Charge transfer channel 16 is depicted in abstract form in FIG. 1. The only gates shown, being shown as dashed lines, are the floating gates and the storage gates immediately before and after each floating gate. This is done to indicate the relative timings of the uni-phase clocking along the various charge transfer channels indicated by respective straight lines.) The other charge transfer channels which underlie each of floating-gate sensor electrodes (e.g., charge transfer channels 19-1 and 20-1 underlying $FG_1$) are operated with uni-phase clocking complementary to the uni-phase clocking of charge transfer channel 16. That is, those gates not having $V_{REF}$ applied to them have the same clock phase $\phi_2$, opposite to clock phase $\phi_1$, applied to them. This is done to implement the subtraction at each floating gate of potential response to the charges in these channels from the potential response to the charge in the analog signal charge transfer channel 16. During interspersed sensing intervals the voltages induced on these floating gates are sensed. Each voltage depends on the difference between the quantity of negative charge that had been transferred from the storage well under the floating gate via analog signal charge transfer channel 16 during an earlier portion of the $\phi_1$ clock interval in which the sensing interval occurs, and the quantity of negative charge that had been concurrently transferred into storage wells under the floating gate via other charge transfer channels. This subtraction process resembles that described by D. G. Maeding in U.S. Pat. No. 4,104,543 issued Aug. 1, 1978 and entitled MULTICHANNEL CCD SIGNAL SUBTRACTION SYSTEM. The charge transfer channels are preferably of the buried type, and they are dimensioned similarly under the floating gate electrodes.

Responsive to application of twice $V_{ONE}$, charge injection stage 13 injects negative charge packets of uniform amplitude $Q_R$ into a charge transfer channel which is the input of a first 18-1 of a cascade connection 18 of charge splitters 18-1, 18-2, ... 18-n, each of which divides the negative charge received at its input into equal halves appearing at its first and second outputs. Each of these charge splitters except for the $n^{th}$—that is, the last—has its first output connected to the input of the succeeding charge splitter. So, their second outputs supply progressively smaller negative charges with binary-weighted amplitudes $Q_R/2$, $Q_R/4$, ... $Q_R/2^n$ to be used as the trial bits applied as respective inputs to "trial bit" charge transfer channels 19-1, 19-2, ... 19-n which underlie floating gate sensor electrodes $FG_1$, $FG_2$, ... $FG_n$ respectively.

FIG. 1 shows a succession 20 of third, "partial sum" charge transfer channels 20-1, 20-2, ... 20-n underlying electrodes $FG_1$, $FG_2$, $FG_3$. At the times charge injection stage 13 injects negative charge packets of amplitude $Q_R$ into the charge-splitting network, charge injection stage 32 injects packets of $Q_0$ into charge transfer channel 20-1. These negative charge packets of amplitude $Q_0$ will be used, assuming $Q_0$ not to be zero-valued, to subtract out fat zero from analog signal samples in the comparisons made in the analog-to-digital conversion process. Each succeeding one of these charge transfer channels 20-2 through 20-n receives input from the output of the preceding partial sum charge transfer channel. It also selectively receives input from the trial bit charge transfer channel passing under the same floating gate sensor electrode as does that preceding partial sum charge transfer channel. Input is received only if the negative charge packet in the trial bit charge transfer channel from the preceding ADC stage has not been drained off to a strain connection, as controlled by a respective one of gate structures $G_1$, $G_2$, ... $G_n$. This draining off is the discarding of the bit presumed-to-be-ONE that occurs when the differential comparison process indicates that the already quantized analog signal and this bit exceeded the analog signal in charge transfer channel 16.

Where fat zero operation of charge injection stage 12 is not used charge transfer channel 20-1 can be dispensed with, together with elements 30, 32, and 34.

Figure 2:
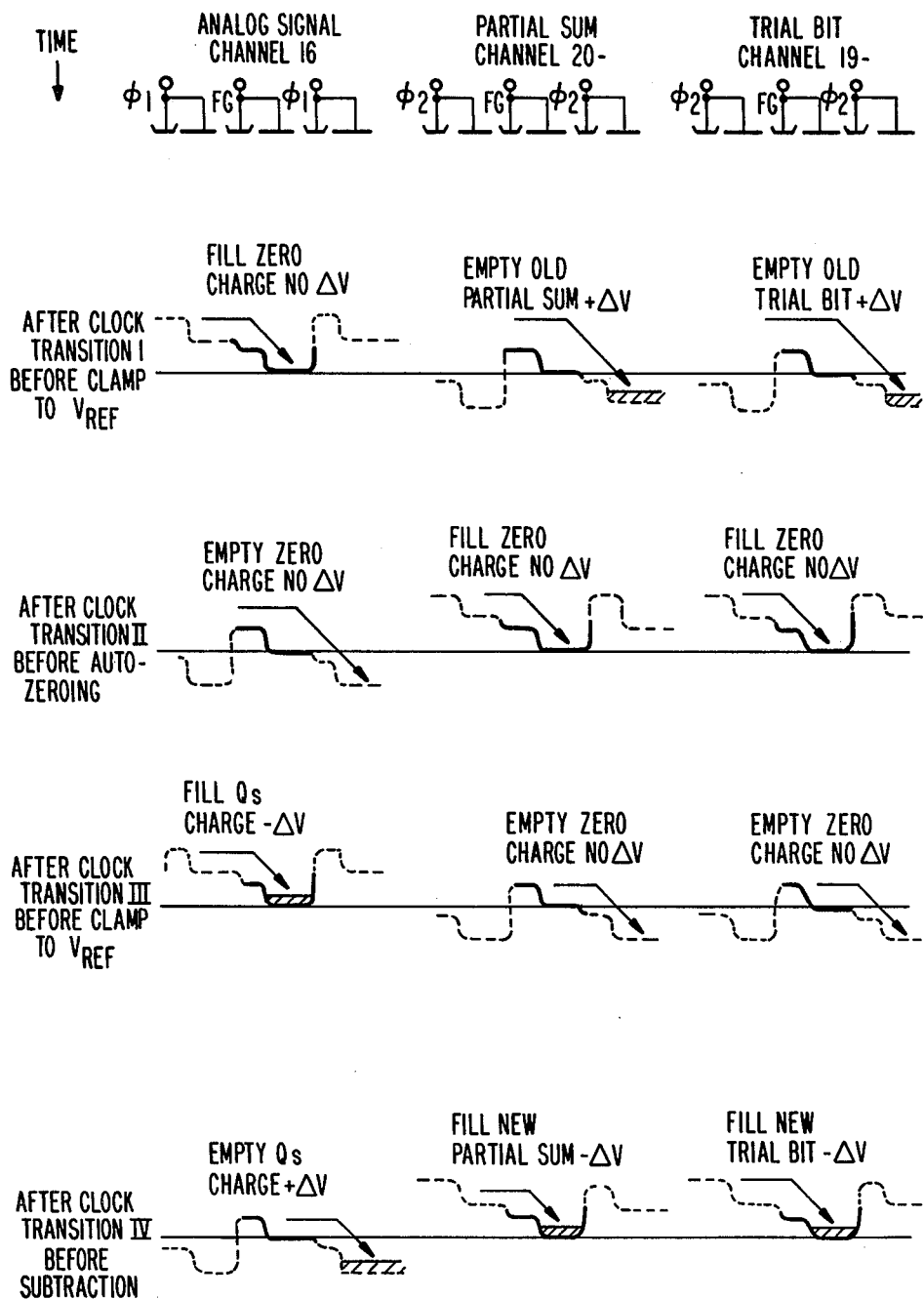
FIG. 2 is a diagram of the electron energy levels under a floating gate electrode in one stage of the ADC, in each of three charge transfer channels thereunder for four successive times in the conversion process, as compared to the electron energy levels under flanking electrodes.

To simplify the following explanation of the charge subtraction process illustrated by FIG. 2, it will be assumed fat zero operation is not used. FIG. 2 is descriptive of the minimum electron energy levels in the three charge transfer channels underlying a unipotential floating gate electrode in any of the ADC stages. The minimum electron energy level under the unidirectional floating gate electrode is shown in heavy black and is associated with the most positive substrate potential present in a p-substrate device. There is a step in each energy level due to a barrier implantation under the second level transfer gate, per conventional practice in CCDs using uni-phase or two-phase clocking. The relative minimum electron energy levels under the electrode flanking that under the floating gate electrode are shown in dashed form for each of the three channels underlying that electrode, at times immediately following four successive transitions in the $\phi_1$ and $\phi_2$ clocks. These transitions I, II, III, and IV occur in order to their ordinal numbering as can be seen by cross-reference to the FIG. 3 timing diagram and describe a full cycle of analog-to-digital conversion including the auto-zeroing preceding the differential comparison step. Clock transition II is that most immediately preceding an auto-zeroing, and clock transition IV is that most immediately preceding a differential comparison to resolve one bit of the analog-to-digital conversion.

Returning attention to FIG. 2, after transition I of the $\phi_1$, $\phi_2$ clocks, $\phi_1$ is low or relatively negative, and $\phi_2$ is high or relatively positive. With electrodes flanking the floating gate in the analog signal channel 16 negative respective to the floating gate electrode, owing to $\phi_1$ being low, the energy well under the floating gate electrode is filled with zero negative charge from the lifted energy well under the preceding $\phi_1$ gate electrode. At the same time the energy wells under the floating gate electrode in the other two channels are emptied of old non-zero negative charge packets, which flow to depressed energy wells under the succeeding gate electrodes to which high $\phi_2$ clock potential is applied.

Thereafter, responsive to a $\phi_R$ pulse, the floating gate electrode is clamped to $V_{REF}$ potential. The path for the clamp current is through three capacitances in series; viz.: the oxide capacitance, the capacitance from semiconductor substrate surface to the buried channel, and the capacitance from the buried channel to substrate ground. The last capacitance is the smallest, owing to relatively great interplate spacing; and the displacement current flow during a clamp of the series connection of the three capacitances operates mainly to change the potential on this last capacitance. The charge on the much larger capacitances, associated with transfer of negative charge in the charge transfer channels, is essentially unaffected.

Subsequently on transition II of the $\phi_1$, $\phi_2$ clocks the electrodes flanking the floating gate electrode in the analog signal channel 16 are high or relatively positive in potential, and those flanking the floating gate electrode over the other charge transfer channels are low or relatively negative in potential. The zero negative charge in the analog signal channel 16 empties into the energy well under the electrode after the floating gate electrode. There is no appreciable change in the floating gate electrode potential with transfer out of zero negative charge. At the same time in the other two charge transfer channels there is a transfer in of zero negative charge, which causes no appreciable change in the floating gate electrode potential. The floating gate electrode remains, then, at essentially $V_{REF}$ during the subsequent auto-zeroing of the sense amplifier it serves as input to. The auto-zeroing of the sense amplifier will, then, be with reference to this essentially $V_{REF}$ potential. Referring to the FIG. 3 timing diagram, auto-zeroing takes place at times when $\phi_S$ and $\phi_{ZR}$ clocks are simultaneously high.

Returning to FIG. 2, transition III of the $\phi_1$, $\phi_2$ clocks follows. The electrodes flanking the floating gate electrode in the analog signal channel 16 are low or relatively negative, and a new negative charge packet $Q_S$ flows into the energy well under the floating gate electrode to cause a negative change in the electrode potential. At the same time zero negative charge packets are transferred out from under the floating gate electrode through the other charge transfer channels because of the electrodes to which $\phi_2$ clock is applied being high, or relatively positive, in potential. This transfer of zero charge causes no change in electrode potential. The floating gate electrode is then clamped to $V_{REF}$ responsive to $\phi_R$ pulse, and the displacement current adjusts the quiescent potential between the buried channel and substrate. The potentials after the charge equilibration remain as the clamp is removed.

Following transition IV of the $\phi_1$, $\phi_2$ clocks the high, relatively positive condition on the $\phi_1$ electrode following the floating gate electrode allows transfer of charge $Q_S$ from the energy well located in channel 16 under the floating gate electrode. This causes a positive component of potential change on the floating gate electrode. At the same time the energy wells located in the other charge transfer channels located under the floating gate electrode are filled with negative charge from the energy wells under the preceding electrodes to which low or relatively negative $\phi_2$ potential is applied. This filling with negative charge of the wells located under the floating gate electrode in the other channels causes respective negative components of potential on the floating gate electrode. After completion of charge transfers, the $\phi_S$ clock goes high while $\phi_{ZR}$ clock remains low and the sense amplifier senses the sum of the positive component of potential induced by charge being emptied from the energy well under the floating gate electrode in the analog signal charge transfer channel 16 and the negative components of potential induced by charge filling the energy wells under the floating gate electrode in the other charge transfer channels.

Figure 3:
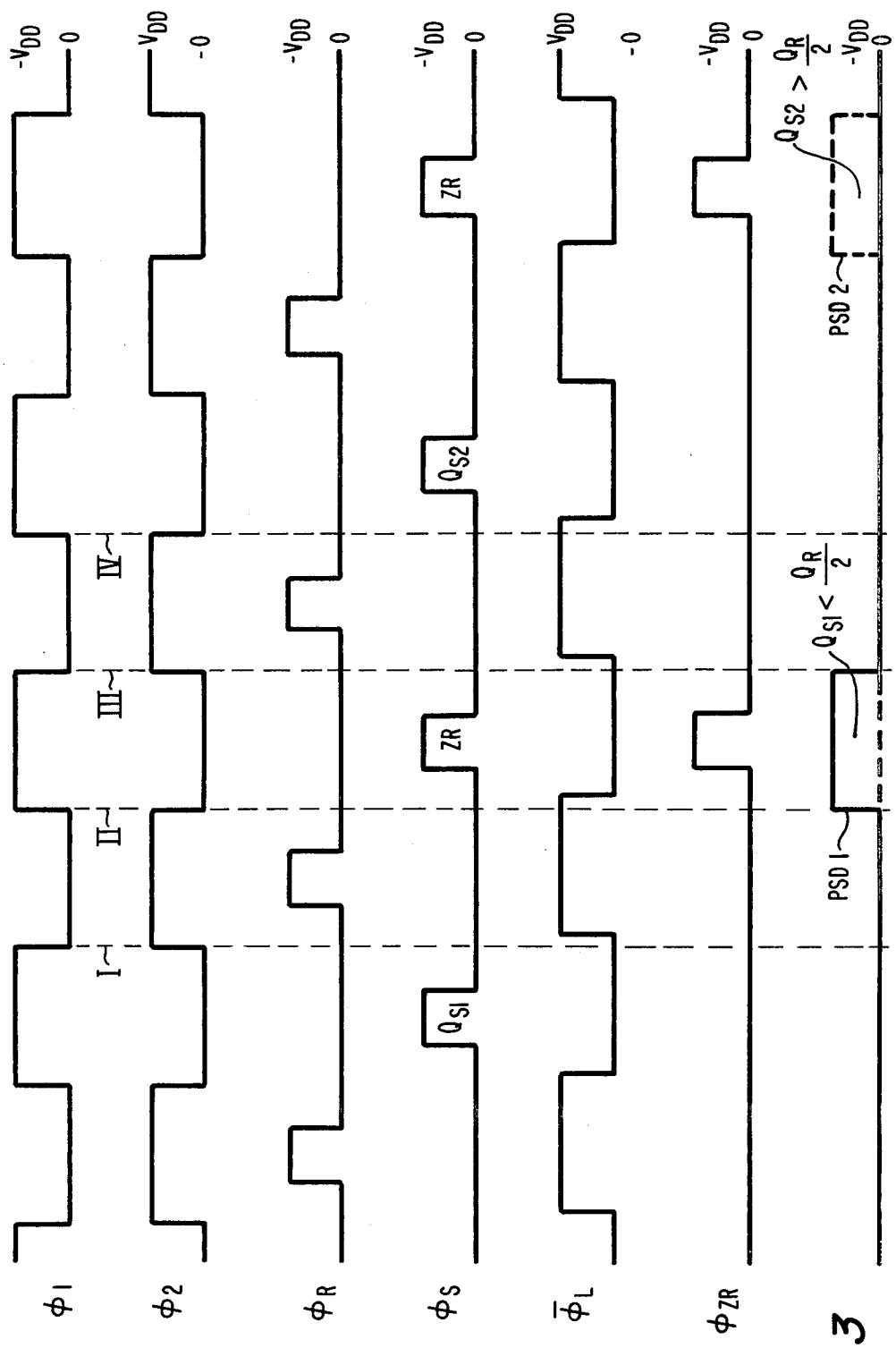
FIG. 3 is a timing diagram showing details of clocking waveforms in the ADC, plotted against a common horizontal time axis with earlier times at left and later times at right.

It is convenient at this point to refer to the FIG. 3 timing diagram, in conjunction with FIG. 1. The "high" conditions of the $\phi_1$ and $\phi_2$ clocks are associated with their equalling a relatively positive operating voltage $+V_{DD}$ which is positive respective to $V_{REF}$ and $V_{ONE}$; and the "low" conditions of the $\phi_1$ and $\phi_2$ clocks are associated with their equalling a ground voltage which is negative respective to $V_{REF}$ and $V_{ZERO}$.

The floating gate sensors $FG_1$, $FG_2$, ... $FG_n$ are recurrently clamped to $V_{REF}$ as noted in the text above concerning FIG. 2. The clamps are to the floating gates $FG_1$, $FG_2$, ... $FG_n$ are made through the channels of respective field effect transistors $FET_1$, $FET_2$, ... $FET_n$, respectively, responsive to a timing pulse $\phi_R$ applied to their gate electrodes. These timing pulses are applied during times the $\phi_1$ clock phase is low and $\phi_2$ clock phase is high. That is, the floating gate electrodes are high respective to the flanking $\phi_1$ phase electrodes in the analog signal charge transfer channel 16 and low respective to the flanking $\phi_2$ phase electrodes in the other charge transfer channels under them.

Consider the case where auto-zeroing is to follow the clamping of the floating gate electrodes $FG_1$, $FG_2$, ... $FG_n$ to $V_{REF}$ at the time when $\phi_R$ is high to clamp the electrodes. The negative charge packets under the floating gate electrodes and in analog signal channel 16 are zero-valued. This is responsive to multiplexer 10 having, at earlier times in the pipeline operation, applied signals to charge injection stage 12 inhibiting its injecting charge into channel 16. During the $\phi_1$, $\phi_2$ clock transition II, which occurs after $\phi_R$ goes low to release the clamps on the floating gate electrodes, there is therefore no charge to be transferred from under the floating gate electrode to wells under the electrodes immediately to right of them in analog signal channel 16, so that the floating gates will remain at $V_{REF}$. During the $\phi_1$, $\phi_2$ clock transition II the charge packets transferred to positions under the floating gates in the other charge transfer channels will be zero-valued, owing to multiplexers 11 having inhibited charge injection stage 13 from injecting charge into the pipeline connection of charge splitters. So there is no negative component induced in any of floating gate electrode potentials by negative charge in any of the charge transfer channels beneath the floating gate electrodes $FG_1$, $FG_2$, ... $FG_n$. Consequently the floating electrodes remain at $V_{REF}$ potential.

Auto-zeroing is performed on the $\phi_S$ pulse following clock transition II, the alternate $\phi_S$ pulses on which auto-zeroing in performed being labelled ZR in FIG. 3. The off-side inputs of the differential comparator input stages of sense amplifiers $SA_1$, $SA_2$, ... $SA_n$—i.e., those inputs not connected to respective ones of floating gate electrodes $FG_1$, $FG_2$, ... $FG_n$—are, then, adjusted so the comparators would toggle if the floating gate electrode potentials were to pass through the $V_{REF}$ level.

Consider now the case where evaluation of the negative charge packets descriptive of analog signal samples from source 14 is to follow the clamping of the floating gate electrodes $FG_1$, $FG_2$, ... $FG_n$ to $V_{REF}$. The negative charge packets under these floating gates and in analog signal channel 16 are descriptive of multiplexer 10 having selected at successive times samples of analog input signal voltage for application to charge injection stage 12. Following the $\phi_1$, $\phi_2$ clock transition IV after $\phi_R$ goes low to release the clamp on the floating gate electrodes, the negative charge packets descriptive of these successive samples are transferred to successive electrodes in analog signal channel 16 to induce on the floating gate electrodes $FG_1$, $FG_2$, ... $FG_n$ positive components of potential descriptive of successive analog signal samples. Following the same $\phi_1$, $\phi_2$ clock transition IV negative charge packets descriptive of successive binary-weighted fractions of $Q_R$ are transferred under floating gate electrodes $FG_1$, $FG_2$, ... $FG_n$ via charge transfer channels 19-1, 19-2, ... 19-n; and negative packets of charge descriptive of partial sum from preceding conversion stages are transferred under floating gate electrodes $FG_1$, $FG_2$, ... $FG_n$ via charge transfer channels 20-1, 20-2, ... 20-n. These negative charge packets induce the negative components of the potentials on the floating gate electrodes.

The resultant potentials on the floating gate electrodes $FG_1$, $FG_2$, ... $FG_n$ are then compared against $V_{REF}$ by sense amplifiers $SA_1$, $SA_2$, ... $SA_n$ respectively, to determine if their positive components responsive to analog signal samples exceed or fail to exceed their respective negative components. The linear combination of negative and positive components of floating gate voltage is highly accurate, and the high resolution of the FIG. 1 ADC depends in large measure on this accuracy. Accuracies of better than 0.2% for a 20 nsec sensing time are anticipated from this subtraction process.

The effects of fat zero operation in modifying the operation just described are as follows. When $\phi_S$ is emptied from under floating gate FG after clock transition IV, the additional component $Q_0$ of negative charge used as fat zero is also emptied tending to raise the potential of FG by an additional increment. This tendency is counteracted by the tendency for the voltage on FG to be decremented by same amount owing to the filling of the well in the partial sum channel, not only by negative charge descriptive of parital sum, but by $Q_0$ originally injected into the succession of partial sum channels by charge injection stage 32. In short, the fat zero operation has no net effect on the comparisons to be made in the analog-to-digital conversion process.

The successive-approximation algorithm which derives from standard level the samples that give rise to the negative components of voltage on the floating gate sensor electrodes $FG_1$, $FG_2$, ... $FG_N$ will now be described in detail. The negative component of voltage on electrode $FG_1$ when being operated as a floating gate sensor is attributable to negative charge packets of amplitude $Q_R/2$ being supplied from charge splitter 18-1. The response of amplifier $SA_1$ to net $FG_1$ electrode potential being negative is indicative that the amplitude of a negative charge packet sampling analog input signal clocked out of a storage well under $FG_1$ electrode via channel 16 on the $\phi_1$ clock transition preceding the sensing interval fails to exceed a negative charge packet of $Q_R/2$ amplitude clocked into a storage well under $FG_1$ electrode via channel 19-1 on the concurrent $\phi_2$ clock transition preceding the sensing interval. This response is subjected to a digital delay $DD_1$. The delayed response $PSD_1$ then forward-biases gate $G_1$ to drain off to a drain connection the negative charge packet at the output of charge transfer channel 19-1, rather than letting it be clocked forward into partial sum charge transfer channel 20-2 during a following clock cycle. (The initials "PSD" used in the alpha numeric descriptions $PSD_1$, $PSD_2$, ... $PSD_n$ of the signals supplied to gates $G_1$, $G_2$, ... $G_n$ to control "dumping" of partial sum channel charge stand for "partial sum dump". $PSD_1$ is shown in solid line in the timing diagram of FIG. 3; and $PSD_2$ is superposed in dashed line on the same time axis.)

In the case just described, in which the partial sum charge from 19-1 is dumped, on the following clock cycle charge transfer channel 19-2 moves a negative charge packet of amplitude $Q_R/4$ under floating gate sensor electrode $FG_2$, but the charge transfer channel 20-2 moves no charge packet under $FG_2$. The ZERO output from digital delay $DD_1$ is forwarded by an (n−1)-bit shift register $SR_1$ to ADC output as its most significant bit—i.e., the bit descriptive of whether binary weight representation of two raised to the (n−1) power is not a part of the quantized analog signal. $SR_1$ is one of (n−1) shift registers successively one stage shorter in the successive sections of the ADC up to the single-stage shift register in the penultimate section of the ADC, which registers convert pipe-lined ADC output to parallel-bit form. These shift registers are preferably CCD registers of surface channel type because of the simpler interfacing with MOS field effect transistor circuitry in the preceeding sense amplifiers.

On the other hand, consider the case where the delayed response of sense amplifier $SA_1$ to net $FG_1$ electrode potential is negative, indicative that the negative charge packet sampling analog input signal has an amplitude which exceeds $Q_R/2$. This response is forwarded to ADC output by shift register $SR_1$ as a ONE most significant bit. The delayed response applied by digital delay $DD_1$ to gate $G_1$ forestalls draining off of charge from the output of charge transfer channel 19-1. So, this negative charge of $Q_R/2$ amplitude, not having been dumped, is clocked forward as input to partial sum charge transfer channel 20-2 during the following clock cycle.

Then, during the following clock cycle, floating gate $FG_2$ will have had total negative charge of amplitude $Q_R/4$ or $3Q_R/4$ moved under it for inducing the negative component of its sensed potential, depending on whether the most significant bit of the ADC process was determined to be a ZERO or a ONE. Subtractive combining of this component of potential, with that responsive to analog input signal during floating gate sensing, supplies sensing amplifier $SA_2$ its input. Its response is a ONE or a ZERO depending on whether $Q_S$ does or does not exceed the amplitude of the negative charge inducing a negative component of potential on electrode $FG_2$. This response is delayed by digital delay $DD_2$ to provide a signal $PDS_2$ that controls gate electrode $G_2$ potential, for draining off negative charge at the output of reference level charge transfer channel 19-2 if the response is ZERO. If the response is a ONE, the negative charge packet is undisturbed and will be clocked forward during the following clock cycle as input to partial sum charge transfer channel 20-3 (not shown). The delayed response from digital delay $DD_2$ is further delayed by (n−2)-bit shift register $SR_2$, so the secondmost significant bit of the pipe-lined ADC is provided in parallel with its most significant bit. This is the bit descriptive of whether binary weight representative of two raised to the (n−2) power is or is not contained in the quantized analog signal.

The successive approximation technique described repeats itself through each successive ADC-section. The $n^{th}$ and final section of the ADC supplies the least significant bit of the conversion directly from digital delay $DD_n$. This is the bit descriptive of whether binary weight representative of 2 would or would not be contained in the quantized analog signal output. If quantized analog signal is not required as an output from the ADC, the output of charge transfer channel 19-n may be directly to drain connection, dispensing with gate structure $G_n$ and the path to a final charge combining as at the input of a further charge transfer channel 20-(n+1).

The operation of this ADC differs from a conventional ADC using a successive-approximation algorithm in that comparisons to binary-weighted fractions of reference level are not made one at a time, but rather a plurality of comparisons n in number are simultaneously made on n successive signal samples. This allows a high conversion rate, half clock frequency, to be obtained. However, the total conversion time for the n bits of ADC output exhibits a delay or latency time equal to n times the time required to obtain each bit of the conversion. E.g., in an 8-bit CCD ADC with four stages per section, the latency time would be 1.6 μsec, presuming a 20 MHz clock frequency and a 10 MHz sampling rate of analog signal from source 14.

Figure 4:
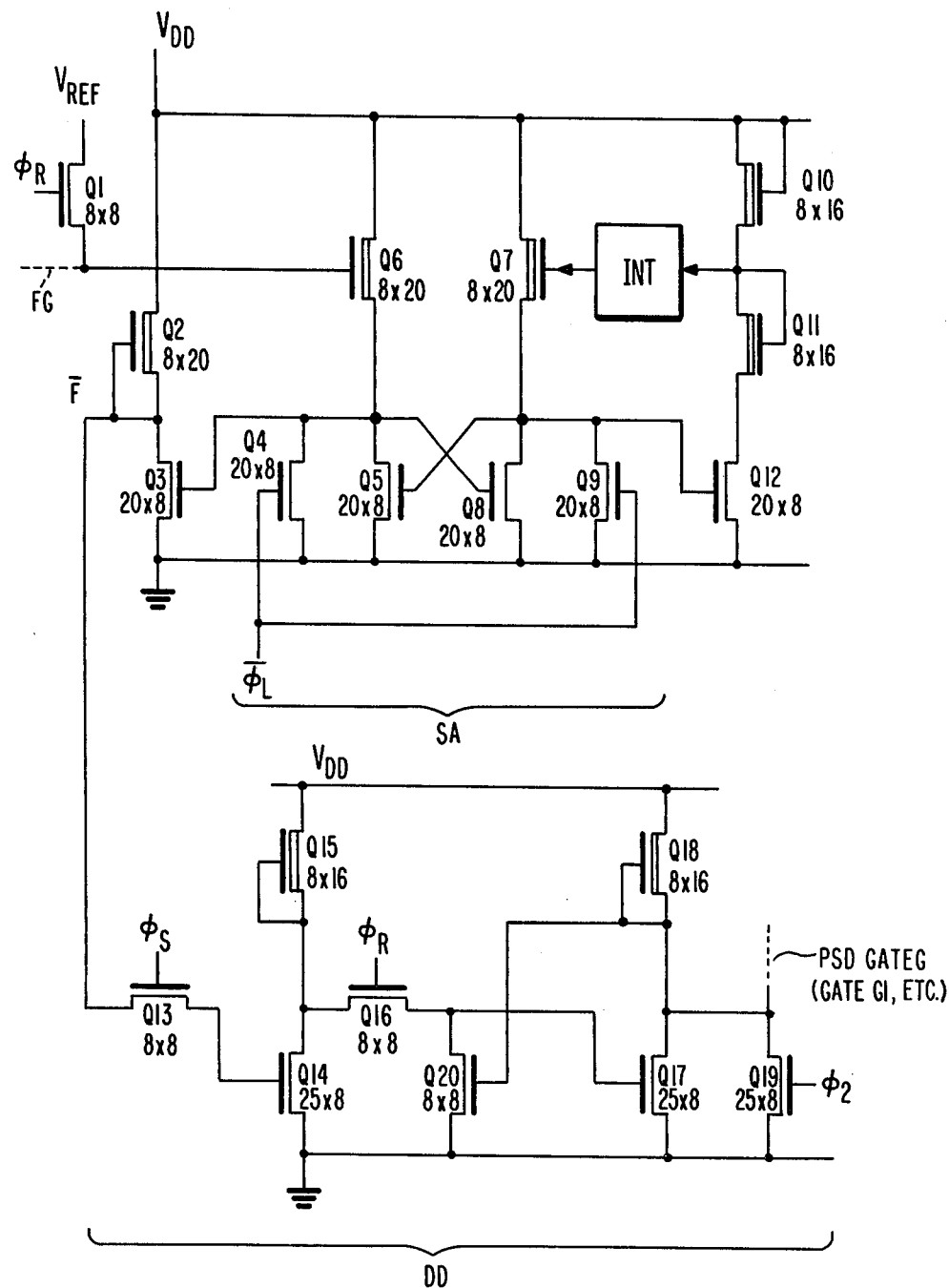
FIG. 4 is a schematic diagram of an auto-zeroing sense amplifier used in the FIG. 1 converter.

FIG. 4 shows a form the auto-zeroed sense amplifiers $SA_1$, $SA_2$, ... $SA_n$ may take. N-channel field effect transistors are employed, some of enhancement-mode type with +1 V. threshold voltages and others of depletion-mode type with −10 V. threshold voltages. The channels of the former are drawn as a double line. Typical channel width-to-length ratio in μm of each FET is shown as a product under its identification alphanumeric. FIG. 3 is a timing diagram of the clock pulse trains applied to the sense amplifiers $SA_1$, $SA_2$, ... $SA_n$ when they are of the form shown in FIG. 4.

In FIG. 4 Q1 with drain to $V_{REF}$ corresponds to $FET_1$, $FET_2$, ... $FET_n$ of any one of sense amplifiers $SA_1$, $SA_2$, ... $SA_n$ of FIG. 1. Q1 source is connected to floating gate sensor electrode FG corresponding to the appropriate one of electrodes $FG_1$, $FG_2$, ... $FG_N$. Q1 gate receives pulses in clock phase $\phi_R$ during each high portion of $\phi_2$ clock phase to clamp floating gate FG to zero reference level $V_{REF}$, which is the voltage to which the sense amplifier SA auto-zeros. $V_{REF}$ is one-half the operating voltage $+V_{DD}$ applied to sense amplifier SA.

Sense amplifier SA comprises enhancement-mode FETs Q4, Q5, Q8 and Q9 and depletion-mode FETs Q6 and Q7. The channels of Q6 and Q7 provide source-follower drain loads to Q5 and Q8, which are connected as a bistable, with the drain of each cross-coupled to the gate of the other. Q4 and Q9 have channels parallelling those of Q5 and Q8, respectively, and provide latching control to the bistable. Responsive to slightly delayed $\phi_2$ clock pulses designated $\phi_L$ clock pulses applied to their gates, Q4 and Q9 clamp the outputs of sense amplifier SA to the ground potential against which its operating potential $+V_{DD}$ is referred. These clamps, which are removed during sensing and during auto-zeroing, prevent positive drift of the drain potentials of Q6 and Q7 towards $+V_{DD}$ during a long series of samples from a zero-valued analog signal from source 14.

The input voltage to sense amplifier SA is the difference between the gate potentials of the depletion-mode FETs Q6 and Q7. The gate of Q6 is connected to receive the potential at floating gate FG. The gate of Q7 has a potential developed by auto-zeroing applied to it.

Auto-zeroing regulates the gate potential of Q7 such that the statistical probabilities of the bistable connection of Q5 and Q8 being in one or other of its stable states are equal over a substantial number of auto-zeroing cycles. Each cycle of auto-zeroing occurs responsive to $\phi_{ZR}$ clock phase going high, which occurs during every other time when $\phi_1$ clock phase is high, at which times the resultant signal voltage component developed by charge under the floating gate FG should be $V_{REF}$. However, a small offset error voltage tends to be present on the floating gate FG owing to the integrated effects of switching transients from the $\phi_1$, $\phi_2$ and $\phi_R$ clock pulses. Also, there is a tendency for some unbalance in sense amplifier SA characteristics. Both tendencies for error are compensated against by the auto-zeroing. In the alternate intervals when clock phase $\phi_1$ is high and $\phi_{ZR}$ clock phase is low, floating gate FG has signal voltage on it and sensing is performed by sense amplifier SA.

As pointed out in the previous paragraph, the objective of the auto-zeroing is to equalize the statistical probabilities of the resolution of $V_{REF}$ input to floating gate being logical ZERO or logical ONE. This is done by adjusting the gate potential of Q7 such that the toggle point of the bistable built around Q5 and Q8 is as precisely as possible that for which FG potential exactly equals $V_{REF}+V_{ZERO}$. When (responsive to the bistable being in the Q5-non-conductive and Q8-conductive state) Q3 is conductive to make the output of sense amplifier SA at Q3 drain a ZERO, Q12 on the offside output of the bistable is non-conductive. On the other hand when (responsive to the bistable being in the Q5-conductive and Q8-non-conductive state) Q3 is non-conductive so Q2 pulls up sense amplifier SA output to a ONE, Q12 on the offside output of the bistable is conductive. The conduction or non-conduction of Q12 offers an indirect indication then of the non-conduction or condition of Q3 and thus an indication of whether sense amplifier SA output is a ONE or a ZERO. By integrating these ONEs and ZEROs over a relatively long time interval one can develop an analog voltage that decreases or increases the gate potential of Q7 depending upon whether the tendency is for more ONEs for or more ZEROs to appear in sense amplifier SA output at Q3 drain, so as to degenerate that tendency.

Considering the structural connections more particularly, the drain of Q12 is connected to $+V_{DD}$ operating through a drain load provided by the serial connection of two diode-connected depletion-mode FETs Q10 and Q11, which function as a resistive potential divider. The tap point of this potential divider connects to the gate of Q7 through an integrator INT, at times $\phi_{ZR}$ clock phase is high. This connection completes the degenerative feedback loop which performs the auto-zeroing.

Figure 5:
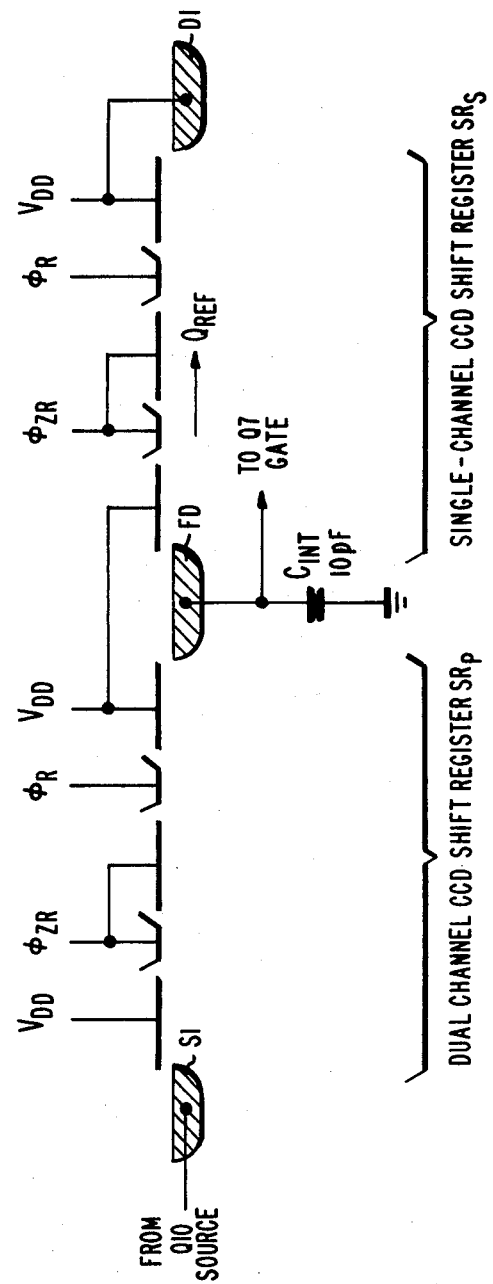
FIG. 5 is a schematic diagram of the CCD low-pass filter used in the FIG. 4 sense amplifier.

Appropriate structure for integrator INT, integrable with the previously described circuitry, is shown in detail in FIG. 5 and was originally described by D. J. Sauer in U.S. Pat. No. 4,139,784 issued Feb. 13, 1979 and entitled CCD INPUT CIRCUITS. N+ diffusions S1 (a source diffusion driven from the source of Q10), FD (a floating diffusion), and D1 (a drain diffusion) are shown in crosshatch. The integrator includes surface-channel CCD shift register stages $SR_P$ and $SR_S$, respectively preceding and succeeding a floating diffusion FD connected to Q7 gate and to an on-chip integrating capacitor $C_{INT}$. CCD shift register $SR_P$ has dual channels similar to the single channel of the CCD shift register $SR_S$ and it receives as input the voltage appearing at the source of Q10. The initial gate of CCD shift register $SR_P$ connects to a $+V_{DD}$ potential and is used to extend the source into the shift register. The output of CCD shift register $SR_S$ is connected to a drain diffusion to which $+V_{DD}$ operating potential is applied. Two-phase clocking is used, with $\phi_R$ and $\phi_{ZR}$ applied as the two clock phases.

There is a barrier implantation in the semiconductive material under the transfer gate in each pair of gates to which clock phase $\phi_{ZR}$ is applied. This implantation creates an asymmetry in the potential well for electrons induced under these gates by clock phase $\phi_{ZR}$ going high, which asymmetry provides for forward propagation of charge during clocking. The potential difference $\Delta V$ between the transfer and storage gates facilitates "fill and spill" admission of negative charge into each of the shift registers $SR_P$ and $SR_S$. In this mode of operation the $\phi_{ZR}$ clock increases the voltage on the gates to fill the asymmetric well with electrons. When the $\phi_{ZR}$ clock returns to $+V_{DD}$ negative charge under the earlier transfer gate of the gate pair spills back into the well induced proximately to the preceding gate with fixed $+V_{DD}$ bias, leaving a packet of negative charge proximate to the storage gate of the uniform size associated with the $\Delta V$ caused by the barrier implantation. This quantum of negative charge is then caused to flow forward when $\phi_R$ clock phase on the succeeding transfer gate subsequently goes high to the well under the storage gate biased to $+V_{DD}$ at the end of the shift register.

Diode-biased depletion-mode FET Q11 forms a potential divider with diode-biased depletion-mode FET Q10 to limit the number of electrons involved in the portion of the fill and spill operation so that the subsequent spill operation can without doubt be completed in the time alloted to it. Where this is not a problem, Q12 drain may connect directly to the integrator INT input. Diode-biased Q10 performs a pull-up operation when Q12 conduction is reduced.

So long as drain of Q12 demands current from integrator INT input, there are electrons to supply the fill and spill operation of the dual channel CCD shift register $SR_P$ and quanta of negative charge are delivered to integrating capacitor $C_{INT}$ which are of twice the amplitude as the quanta of negative charge drained from to $C_{INT}$ by fill and spill operation of the single-channel CCD shift register $SR_S$. So the negative charge stored between the plates of $C_{INT}$ increases, and by Coulomb's Law the voltage across $C_{INT}$ decreases. The resulting more negative gate voltage applied to n-channel source-follower FET Q7 tends to decrease its conduction during auto-zeroing vis-a-vis that of Q6. When the conduction of Q7 is less that of Q6 during auto-zeroing, Q12 is biased for reduced conduction and supplies fewer electrons to the input of integrator INT. Charge is unavailable for filling the shift register $SR_P$ input when $\phi_{ZR}$ goes high, so the supply of negative charge quanta to $C_{INT}$ is curtailed. But the draining away of quanta of negative charge from $C_{INT}$ by shift register $SR_S$ continues, decreasing the negative charge stored between the plates of $C_{INT}$ and increasing the voltage between them. The resulting more positive voltage applied to Q7 tends to increase its conduction during auto-zeroing vis-a-vis that of Q6, so Q12 is biased for increased conduction. The digital feedback loop described in this paragraph stabilizes when the number of times Q7 is less conductive than Q6 during auto-zeroing is, on reasonably long time average as determined by charge quanta size and capacitance of $C_{INT}$, equal to the number of times Q7 is more conductive than Q6 during auto-zeroing. This makes the biasing of Q6 and Q7 relative to each other optimum for sensing whether or not the change on FG owing to $Q_R/2^n$ flow through channel 19-n exceed that flowing through the other channels under that gate. The steady-state voltage across across $C_{INT}$ (i.e., on FD) is close to $V_{REF}=V_{DD}/2$ because the sense amplifier SA is made to be basically balanced, with Q5 and Q8 being structurally identical to each other and with Q6 and Q7 being structurally identical to each other.

Surface channel CCDs are used in the FIG. 5 integrator because of the simple interface they have with the MOS devices of the sense amplifier SA and because the area taken up by the CCDs relative to the integrating capacitor $C_{INT}$ is smaller than with buried-channel devices. Because of the small amounts of incremental charge transfer in the FIG. 5 filter each clock cycle, the lower transfer efficiency of the surface-channel devices as compared to buried-channel devices is not of concern. Typically, the rectangular storage gates in the single-channel CCD shift register $SR_S$ are 6 μm wide by 9 μm long, and those in the dual-channel CCD shift register $SR_P$ have twice the area.

Returning to consideration of the FIG. 4 apparatus and the related FIG. 3 timing diagram, after auto-zeroing has been completed with $\phi_{ZR}$ dropping low, (after the $\phi_1$ clock has gone low and the $\phi_2$ clock has gone high so the floating gate FG has charge dependent on analog signal from source 14 stored under it, and after $\phi_L$ clock has gone low removing the clamps imposed on the gate potentials of Q3 and Q12 by conduction of Q4 and Q9), the drain potential of Q3 is ground or $+V_{DD}$ depending on whether the potential on the floating gate FG exceeds or fails to exceed $+V_{DD}/2$.

Q3 drain potential variation is then delayed by one clock cycle time to arrive at the one, G, of the gates $G_1$, $G_2$, ... $G_n$ associated with that one, SA, of the sense amplifiers $SA_1$, $SA_2$, ... $SA_n$ using digital delay DD. The one cycle delay compensates for a corresponding delay between floating gate FG and the point in the reference charge transfer channel where charge is selectively drained off responsive to gate G of the charge dumping transistor being high. Digital delay DD is shown as dynamic shift register. Enhancement-mode FET Q14 is connected as a common-source transistor in the first half-storage of digital delay, which also includes enhancement-mode FET Q13 connected as a transfer gate and depletion-mode FET Q15 connected as a constant-current-generator load for Q14. Enhancement-mode FET Q17 is connected as a common-source transistor in the second half-stage of digital delay in cascade connection after the first, which second half-stage of digital delay also includes an enhancement-mode FET Q16 connected as a transfer gate and depletion-mode FET Q18 connected as a constant-current-generator load for Q17. Transistor Q20 provides the regenerative feedback for operating this second half-stage of digital delay as a half-latch, to force resolution of the output of the digital delay to be either logical ONE or logical ZERO and avoid an in-between output voltage condition.

Charge is placed on the gate of Q14 according to the value of Q3 drain potential that is being applied to the gate of Q14 when the channels of Q13 is conductive responsive to clock $\phi_S$ going high. When clock $\phi_S$ goes low to halt conduction through the channel of Q13, the source of Q15 is left at $+V_{DD}$ when Q3 has been close to ground so the threshold voltage $V_{T-Q14}$ of enhancement-mode FET Q14 has not been exceeded, or is left close to ground when Q3 has been close to $+V_{DD}$ so $V_{T-Q14}$ has been exceeded. When clock $\phi_R$ subsequently goes high to render the channel of Q16 conductive, the potential at the source of Q15 is applied to the gate of enhancement-mode FET Q17. If the drain potential of Q3 had originally been close to $+VDD$ so the source potential of Q15 was brought close to ground by conduction of Q14 when the channel of Q16 was conductive, and the threshold voltage $V_{T-Q17}$ of Q17 was thus not exceeded, then when clock $\phi_R$ goes low and clock $\phi_1$ subsequently goes high Q17 remains non-conductive. Constant-current-generator load transistor Q18 pulls gate G to $+V_{DD}$ rail so the partial sum charge is dumped, rather than being forwarded to the partial sum channel of the next ADC stage. When clock $\phi_1$ goes low and clock $\phi_2$ goes high, Q19 is biased into conduction to clamp gate G to ground to halt charge dumping.

If the drain potential of Q3 had originally been close to ground, however, so the source potential of Q15 was close to $+V_{DD}$ owing to non-conduction of Q14 when the channel of Q16 was conductive, and $V_{T-Q17}$ was thus exceeded, then when clock $\phi_R$ goes low and clock $\phi_1$ subsequently goes high Q17 remains conductive to clamp gate G to ground potential. So no charge is dumped from the reference channel, but is instead forwarded to the partial sum channel of the next ADC stage. Conduction of Q19 on the following $\phi_2$ clock continues to keep gate G clamped to ground.

In the embodiment of the invention described, the clocking of negative charge packets under the floating gate electrodes is such that samples of the analog signal have samples of the analog signal as thusfar quantized and trial bit samples subtracted from them. Embodiments of the invention are possible wherein the clocking of the negative charge packets under the floating gates is such as to subtract samples of the analog signal from the summed samples of the analog signal as thusfar quantized and trial bit samples, an appropriate logical inversion being included in each of the sense amplifiers. The claims which follow should be broadly enough construed to include such variants within their scope according to the doctrine of equivalence.

What is claimed is:

1. An analog-to-digital converter comprising:
   a plurality, n in number, of CCD comparator structures, each for furnishing a respective output indication of first or second sort depending on whether or not a charge packet input supplied to a first input connection thereof exceeds charge packet inputs respectively supplied second and third input connections thereof, said comparator structures being consecutively ordinally numbered first through $n^{th}$;
   means for generating clock signals having cycles assumed to be consecutively numbered from a reference time for purpose of definition in claiming;
   means for supplying respective charge packets on each successive clock cycle, descriptive of an analog input signal level on evenly numbered clock cycles and of a zero level on oddly numbered clock cycles;
   a first pipeline connection for successively admitting on successive clock cycles each of those charge packets to the first input connections of said CCD comparator structures in reverse order of their ordinal numbering;
   means for supplying to the third input connection of each CCD comparator structure respective charge packets each successive clock cycle, descriptive of a trial bit level on evenly numbered clock cycles and of a zero level on oddly numbered clock cycles, the respective reference levels being related in substantially binary weighting with progressively larger reference levels being applied to CCD comparator structures in said plurality with successively higher numbers;
   respective means associated with each CCD comparator structure except the first for applying on the succeeding clock cycle the charge packet formerly applied to its second connection to the second input connection of the CCD comparator structure with next lower ordinal numbering; and
   respective means responsive to each CCD comparator structure except the first furnishing a respective output indication of said first sort for applying on the succeeding clock cycle the charge packet formerly applied to its third input connection to the second input connection of the CCD comparator structure with next lower ordinal number.

2. An analog-to-digital converter as set forth in claim 1 having:

means, included within said means for supplying respective charge packets on each successive clock cycle, for augmenting each of the charge packets supplied on evenly numbered clock cycles with a fat zero bias charge; and means for supplying to the second input connection of said first CCD comparator structure a fat zero bias charge on evenly numbered clock cycles.

3. An analog-to-digital converter as set forth in claim 1 or 2 wherein said means for supplying to the third input connection of each CCD comparator structure respective charge packets each successive clock cycle comprises:

means for supplying respective charge packets each successive clock cycle, descriptive of substantially twice a standard reference on evenly numbered clock cycles and of a zero level on oddly numbered clock cycles; and charge splitter means for successively halving each of these charge packets, the progressively smaller half charge packets being respectively applied to the third input connections of CCD comparator structures in said plurality with successive higher ordinal numbers.

4. An analog-to-digital converter as set forth in claim 1 or 2 comprising:

serial-to-parallel converter means differentially delaying the output indications of said CCD comparator structures, so all the bits of the digital value of an analog sample appear parallel in time.

5. An analog-to-digital converter comprising:
a semiconducting substrate;
a plurality, n in number, of charge sensing electrode structures, consecutively ordinally numbered first through $n^{th}$;
first and second sets of intervening charge-coupling electrodes;
an analog signal charge transfer channel across which each of said sensing electrode structures and of the first set of intervening charge transfer electrodes extend, the position of said sensing electrode structures along said channel being ordered according to their ordinal numbering in the direction opposite to that in which charge packet propagation is to be conducted;
a plurality, n in number, of trial bit charge transfer channels in said substrate across which respective ones of said plurality of sensing electrode structures and portions of said second set of charge transfer electrodes extend, each of said trial bit charge transfer channels ordinally numbered the same as the sensing electrode structure that extends thereacross;
a number, $n-1$, at least one, of partial sum charge transfer channels, across each of which extends a respective one of the sensing electrode structures ordinally numbered smaller than $n^{th}$ and another portion of said second set of charge transfer electrodes, each of said partial sum charge transfer channels ordinally numbered the same as the sensing electrode structure that extends thereacross;
means applying first and second clocking signals staggered in time to said first and second sets of intervening charge-coupling electrodes, for causing transfer of charge packets to and from under the sensing electrode structures in said analog signal charge transfer channel at the times charge packets and transferred from and to respectively under those electrodes in the other charge transfer channels;
means for recurrently clamping said charge sensing electrode structures to a reference potential prior to times charge is transferred from under them in said analog signal charge transfer channel and to under them in the other charge transfer channels;
means for injecting a train of charge transfer packets into said analog signal transfer channel, which packets are samples of input analog signal taken during alternate cycles of said first clocking signal interleaved in time with samples of an input signal zero level taken during intervening cycles of said first clocking signal;
means for injecting a respective train of charge packets into each of said trial bit charge transfer channels, which packets are samples that alternate between a respective pair of higher and lower charge levels during alternate cycles of said second clocking signal, the differences in these charge levels in the trial bit transfer channels having binary weightings according to their ordinal numbers, the higher charge levels being injected in such phasing as to be transferred to under sensing electrode structures as samples of input analog signal are transferred from under those sensing electrode structures;
a plurality, n in number, of sense amplifiers consecutively ordinally numbered first through $n^{th}$ having respective input connections to sensing electrode structures with equal ordinal numbering and having respective output connections for furnishing digital indications of a first sense or of a second sense, opposite to the first, dependent on whether charge transferred from under the sensing electrode structures to which their respective input connections are made exceeds or fails to exceed the the charges transferred to under those structures;
said sense amplifiers being auto-zeroed after times input signal zero-level charges are transferred from under the sensing electrode structures in the analog signal charge transfer channel and zero-level charges are transferred to under the sensing electrode structures in the other charge transfer channels, and said sense amplifiers supplying said digital indications after times analog input signal sample charges are transferred from under the sensing electrode structures in the analog signal charge transfer channel and charges are transferred to under the sensing electrode structures in the other charge transfer channels;
means responsive to digital indications of a second sense from each of said sense amplifiers other than the first for injecting the output of the partial sum charge transfer channel which is similarly ordinally numbered into the input of the partial sum charge transfer channel having an ordinal number smaller by unity; and
means responsive to digital indications of a first sense from each of said sense amplifiers other than the first for injecting the sum of the outputs of the partial sum charge transfer channel and of the trial bit transfer channel which are similarly ordinally numbered into the input of the partial sum charge transfer channel having an ordinal number smaller by unity.

6. An analog-to-digital converter as set forth in claim 5 including:

means for admixing a respective fat zero bias charge with each of said charge packets which are samples of input analog signal injected into said analog signal transfer channel;

a further partial sum charge transfer channel across which said $n^{th}$ sensing electrode structure extends, having an output connection to the input connection of said $n-1^{st}$ partial sum charge transfer channel, and having an input connection; and means for injecting a train of charge packets into the input connection of said further partial sum charge transfer channel, which packets are samples that alternate between a higher charge level and a lower during alternate cycles of said clocking signal, which levels are chosen to suppress response to fat zero bias charge by said sense amplifiers.

7. An analog-to-digital converter as set forth in claim 5 or 6 in combination with:

means differentially delaying the digital indications from said signal sensing electrode structures by one more clock cycle of both first and second clock signals for each increase by unity in ordinal numbering of signal sensing electrode structure, for providing parallel-bit digital output response to analog input signal.

8. An analog-to-digital converter as set forth in claim 5 or 6 wherein said means for a respective train of charge packets into each of said trial bit charge transfer channels includes:

means for supplying zero charge and a reference level charge during alternate cycles of said second clocking signal; and charge splitter means for successively splitting the reference level charge thus supplied and applying the successively smaller split off charges to said trial bit charge transfer channels in order of decreasing ordinal numbering.

9. A pipeline method of generating digital representations of the amplitudes of charge packets representative of successive samples of an analog signal, said method comprising the steps of:

delaying said charge packets descriptive of analog signal samples by applying them to the input of a charge coupled device operative as tapped delay line for supplying at its taps each of said charge packets a series, n in number, of times respectively at progressively longer time intervals after its application to the input of said charge coupled device;

as each progressively longer time interval finishes, comparing the amplitude of the charge packet representative of said analog signal sample to the combined amplitudes of a charge packet representative of a progressively smaller binary fraction of a reference sample and of a charge packet representative of a respective partial sum sample for each comparison, the partial sum sample for the initial comparison being assumed zero, each step of said comparing being done without prior merger of the three charge packets involved therein for generating a bit value; and if the bit value be indicative that the amplitude of said charge packet representative of said analog signal sample is larger than the combined amplitudes of the charge packets against which it is compared merging the charge packet representative of the binary fraction and the charge packet representative of the partial sum sample for that comparison to generate the charge representative of the partial sum sample for the succeeding comparison.

10. A method for generating digital representations of the amplitudes of successive samples of an analog signal, as set forth in claim 9, including the step of:

delaying the bit values obtained by successive comparisons by progressively shorter time intervals, for aligning in time the bit values descriptive of the amplitude of each analog signal sample.

* * * * *